United States Patent [19]

Howe

[11] Patent Number: 4,521,800
[45] Date of Patent: Jun. 4, 1985

[54] MULTILAYER PHOTOELECTRODES UTILIZING EXOTIC MATERIALS

[75] Inventor: Arthur T. Howe, Naperville, Ill.

[73] Assignee: Standard Oil Company (Indiana), Chicago, Ill.

[21] Appl. No.: 434,603

[22] Filed: Oct. 15, 1982

[51] Int. Cl.³ .............................................. H01L 23/48
[52] U.S. Cl. ....................................... 357/67; 357/81; 357/42; 357/30; 357/65
[58] Field of Search ....................... 357/67, 61, 42, 30, 357/65; 250/423 R; 264/61; 428/469; 252/513

[56] References Cited

U.S. PATENT DOCUMENTS

| | | | |
|---|---|---|---|
| 3,887,993 | 6/1975 | Okada et al. | 357/42 X |
| 3,928,242 | 12/1975 | May | 252/513 |
| 4,367,429 | 1/1983 | Wang et al. | 250/423 R X |
| 4,397,800 | 8/1983 | Suzuki et al. | 264/61 |
| 4,426,423 | 1/1984 | Intrater et al. | 428/469 X |

OTHER PUBLICATIONS

Skotheim et al., "Photoelectrochemical Behavior N-S: Electrodes Protected with Pt-Polypyrrole", *J. Electro. Chem. Soc.*, vol. 129, p. 1737.

Thompson et al., "Photoelectrochemical Generation of Chlorine on Catalytically Modified N-Silicon/Inoium Tin Oxide Anodes," *J. Electrochem. Soc.*, vol. 129, p. 1934.

Rajeshwar et al., "Novel Concepts in Photoelectro Chemical Cells," *Seri Report SERI/CP-211-1434*, 4th Electrochem. Photovoltaic Cell Contractors Rev. Meeting, Denver, Colorado, Oct. 16-17, 1981, p. 135.

*Primary Examiner*—Andrew J. James
*Assistant Examiner*—William A. Mintel
*Attorney, Agent, or Firm*—Richard A. Kretchmer; William T. McClain; William H. Magidson

[57] ABSTRACT

A corrosion-resistant, multilayer photoelectrode for use in a photoelectrochemical cell and a process for producing said photoelectrode by preparing an effective layer of an insulator material on a base semiconductor and depositing a layer of conducting material on said layer of insulating material.

8 Claims, 1 Drawing Figure

MULTILAYER PHOTOELECTRODES UTILIZING EXOTIC MATERIALS

BACKGROUND OF THE INVENTION

This invention relates to a stabilized multilayer photoelectrode immersed in an electrolyte in a photoelectrochemical cell, wherein said photoelectrode comprises a base semiconductor, an effective layer of insulator material on said semiconductor and an effective layer of conducting material on said insulator material. More particularly, this invention relates to a silicon based photoelectrode which comprises silicon, an effective layer of oxide on said silicon, and an effective layer of conducting material on said oxide layer.

Photoelectrochemical cells are capable of generating direct electrical energy as well as providing a means for storage of solar energy. The basic photoelectrochemical cell comprises a photoelectrode, a counterelectrode and one reduction-oxidation or redox couple in an electrolyte. The simplest photoelectrode in the basic cell comprises a semiconductor with the front face thereof illuminated by solar radiation and in direct contact with the redox-electrolyte solution which contains the redox couple. The back face of the semiconductor is connected to an insulated wire, and a voltage is generated between the back face contact and the counterelectrode, with electrons traveling in an external circuit formed by the wires between the two electrodes; and ions pass through the electrolyte between the two electrodes, completing the electrical circuit. The junction between the redox-electrolyte solution and semiconductor photoelectrode is a diode junction which acts much the same as a p-n junction in a solid state solar cell; however, since the junction between the electrolyte and semiconductor is a property of the interface, its formation does not require the precise diffusion of dopant material into the semiconductor which is usually important in a solid state device. The photoelectrochemical cell therefore has substantial differences from conventional solid state photovoltaic cells. These differences lead to important advantages over conventional solid state photovoltaic cells, such as the ability to use a broader range of materials for efficient cell operation, the ability to avoid the constraints of lattice parameter matching between adjacent material layers, which is necessary for nearly all solid state photovoltaic devices, and the ability to use small grain size semiconductor material without any substantive decrease in solar conversion efficiency.

All these advantages of the photoelectrochemical cell have the potential of leading to lower costs for production and storage of energy; but unfortunately, photoelectrochemical cells have some difficulties: (a) cell lifetimes are extremely short due to cell malfunctions caused by unwanted corrosion effects arising at the junction of the photoelectrode and electrolyte solution, and (b) voltages and currents are often less than would be expected due to undesirable effects which arise, typically from flow of large currents the reverse of the desired direction (dark currents) or from recombination currents which diminish cell output and efficiency.

A number of publications have disclosed various attempts to prevent corrosion of the semiconductor photoelectrode in a photoelectrochemical cell. One approach has been to utilize thin protective metal films, particularly gold and platinum, over the base semiconductor (see T. Skotheim, I. Lundstrom, and J. Prejza, *J. Elec. Soc.: Accel. Comm.*, Vol. 128, 1625 (1981)); however the films must be thin in order to permit light to pass through to the semiconductor, it is difficult to produce uniform, impermeable, thin metal layers, and corrosion still occurs. Even if the problem of corrosion protection were solved by a thin metal film, the voltage output, and consequently cell efficiency, are substantially reduced due to the ease of reverse dark current flow across the semiconductor-metal film junction.

A second approach to stabilize the photoelectrode concerns the use of an ultra-thin layer of a wide band gap oxide, typically $TiO_2$ or $SnO_2$, over the base semiconductor (see A. J. Nozik, *Second International Conference on Photovoltaic Conversion and Storage of Solar Energy*, Aug. 8, 1978, Cambridge, England). Films such as $TiO_2$ are transparent but are also insulating in character and if deposited with thickness sufficient to protect against corrosion, the photogenerated charge carriers cannot penetrate the insulating layer and thus the insulator layer prevents operation of the cell. $SnO_2$ layers are also transparent to light, are more corrosion resistant than $TiO_2$, and can be made conductive by doping; however, $SnO_2$ has virtually no electrocatalytic activity (the ability to enhance the kinetic exchange between electrons in the conducting layer and the redox reaction in the electrolyte solution). Electrocatalytic activity is quite important in driving the desired redox couple reaction in the electrolyte solution. Therefore, unless an electrocatalytically active layer is deposited on the $SnO_2$ layer, a photoelectrochemical cell, which uses $SnO_2$ alone as a corrosion protective layer, has an extremely low cell output.

A third approach to prevent photoelectrode corrosion concerns coating of the base semiconductor with an organic conductor layer (see R. Noufi, O. Tench, and L. F. Warren, *J. Electrochem. Soc.* 127, 2310 (1980)); however, severe problems are encountered in aqueous electrolyte solutions, with the organic layers showing poor adhesion and at best providing protection for only a few days. A fourth corrosion protection scheme concerns formation of derivatized layers over the base semiconductor which are covalently bonded with the surface layer of the base semiconductor, but photoelectrode stability is maintained for only several days (see J. M. Bolts, A. B. Bocarsky N. C. Palazzotto, E. J. Walton, N. S. Louis, and M. S. Wrighton, *J. Am. Chem. Soc.* 101, 1378 (1979)).

Consequently, none of these references discloses a photoelectrode which is stable for any time period in excess of several days, and which produces a high cell output with good efficiency. Accordingly, there is a need for an improved corrosion resistant photoelectrode which has a long lifetime and shows improved photocell output and efficiency in the conversion of electromagnetic radiation to electrical power.

The general object of this invention is to provide an improved efficiency, high output, corrosion resistant photoelectrode in a photoelectrochemical cell. A more specific object of this invention is to provide an improved efficiency, high output, corrosion resistant, silicon based photoelectrode in a photoelectrochemical cell with effective insulator and conducting layers on the base semiconductor. Other objects of this invention will be apparent to persons skilled in the art from the following appended claims.

BRIEF DESCRIPTION OF THE DRAWING

The attached drawing is a cross-sectional view illustrating one embodiment of the ohmic contact of this invention.

DESCRIPTION OF THE INVENTION

We have found that the objects of the invention can be obtained by a photoelectrochemical cell comprising a multilayer photoelectrode which comprises a semiconductor, an effective layer of insulator material on said semiconductor, and an effective layer of conducting material on the insulator layer. A preferred version of the invention comprises a photoelectrochemical cell comprising a photoelectrode comprising silicon, an effective layer of silicon oxide or non-native oxide on said silicon, and an effective conducting layer on said oxide layer, wherein said oxide and conducting layers are substantially continuous and pin hole free.

Briefly, this invention comprises a photoelectrochemical cell comprising a multilayer photoelectrode which is resistant to corrosion by the redox-electrolyte solution present in a photoelectrochemical cell. The most typical prior art redox-electrolyte/photoelectrode junction consists of a photoelectrode of a semiconductor alone or a semiconductor plus metal layer, and the photoelectrode is in direct contact with the redox-electrolyte solution. With this well known junction the corrosion reactions proceed rapidly. However, in the present invention, the photoelectrode comprises a base semiconductor, an insulator layer over the semiconductor, and a conducting overlayer which is in contact with the redox-electrolyte solution.

In the simplest photoelectrochemical cell the diode characteristics and voltage output of the cell are determined by differences in the chemical potential of the redox couple in the redox-electrolyte solution and the chemical potential of the semiconductor photoelectrode. In the instant invention the properties of the diode junction and voltage output are determined by contributions from the insulator layer, the conducting layer, and also the redox-electrolyte versus the base semiconductor, rather than just the redox-electrolyte solution versus the semiconductor, as in the simple photoelectrochemical cell. Thus, the diode junction properties in this invention derive from a difference in chemical potential between the semiconductor potential and the sum of the other multilayer potentials including the redox couple in the redox-electrolyte solution. In the present invention the contribution of each of the portions of the photoelectrode in determining the net chemical potential as experienced by the base semiconductor arises from the following: (a) static charge and possibly the effective work function for the insulator, (b) work function for the conducting layer, and (c) the chemical potential for the redox couple in solution, as determined by the redox potentials (see M. A. Butler and D. S. Ginley, *J. Matl. Sci.* 15, 1 (1980)). These effects combine to produce an increased chemical potential, and the greater the net difference in chemical potential between the summation of these components and the base semiconductor, the larger the photovoltage produced by the cell. The dominating role of the redox-electrolyte in this potential energy summation is demonstrated in the special instance in which the conducting layer does not have the appropriate work function property for the photoelectrochemical cell to function in air without the redox-electrolyte being present, i.e., the chemical potential does not have the proper sign to permit operation. When the cell is immersed in a redox-electrolyte of the correct redox potential, the energy barrier between the electrolyte and photoelectrode is determined by the redox couple in the redox-electrolyte, and not by the conducting layer, and thus the cell now functions.

In a photoelectrochemical cell the base semiconductor functions either as a light-sensitive anode or a cathode, depending on whether the semiconductor is n- or p-type, respectively. The fact that there is an n-type or p-type semiconductor in contact with a system of different net chemical potential results in formation of a diode type region which is depleted of majority carriers (electrons in n-type, holes in p-type) at the semiconductor surface. This effect arises because within this depletion layer there exists an electric field which is able to separate spacially the electrons, which are optically excited by light illumination to the conduction band, from the holes left behind in the valence band. Thus, when the semiconductor is illuminated with photons of energy greater than the band gap of the base semiconductor, electrons are excited into the conduction band. Those electron-hole pairs created in the depletion layer are separated by the electric field in the depletion layer before the holes and electrons can recombine. The majority carriers then pass through the base semiconductor to the back face ohmic contact and are drawn off as a current by an insulated wire. In the multilayer photoelectrode the minority carriers are drawn across the insulator layer adjacent the base semiconductor by tunneling through the insulator layer, and are passed through an outer conducting layer to the interface with the redox-electrolyte and react with the redox components in the redox-electrolyte.

The present invention in one aspect is operable as a regenerative photoelectrochemical cell wherein only one redox couple is present in the redox-electrolyte; thus, for example, reduction will occur at the photoelectrode while the inverse oxidation will take place at the counterelectrode. Consequently, in the reversible iodine-iodide system, the reaction $I_2 + 2e^- \rightarrow 2I^-$, takes place at the cathode; and the opposite reaction, $2I^- \rightarrow I_2 + 2e^-$, occurs at the anode with $e^-$ flow in the external circuit and $I^-$ flow in the redox-electrolyte between electrodes. Therefore, in such a system there is no net chemical change, and the power produced by the photoelectrode is extracted via the external electrical load.

The presence of a redox-electrolyte in a photovoltaic cell not only acts to form a convenient diode junction, as in the regenerative cell just described, but also readily permits the storage of electrical power. Using conventional photovoltaic cells, external batteries need to be utilized to store energy. Similarly in the case of regenerative photoelectrochemical cells, external storage batteries are necessary to store energy. Energy can, however, be stored internally in a particular variety of photoelectrochemical cell which has at least two redox couples. Therefore in another aspect of the instant invention, the storage-type cell includes a photoelectrode immersed in a first redox-electrolyte solution containing a first redox couple (such as iodine-iodide) and a counterelectrode, typically platinum, immersed in a second redox-electrolyte (which can be the same as the first redox-electrolyte) containing a second redox couple (such as bromine-bromide). The two redox couples are separated from each other by an ion conducting membrane which allows maintenance of charge balance between the two compartments by flow of a nonactive species (for example, $H^+$, $Na^+$, $K^+$, $Cl^-$) present in the redox-electrolytes. The driving force for the storage cell is the difference in the free energy of reaction between the two different redox couples taking into account the relative concentrations, and energy is stored by each redox couple by driving the redox reactions with the photoenergy produced from illumination of the photoelectrode. Alternatively, rather than allowing the reduction-oxidation reactions to take place, the charge carriers are collected at the surface of the electrodes by metallic contacts, and the charge is removed to perform useful work directly.

For the instant invention a storage-type redox cell which stores power by oxidation-reduction reactions, has the following operation: (a) quanta of electromagnetic radiation enter the semiconductor and hole-electron pairs are formed; (b) electrons tunnel through the insulator layer; (c) the electrons or holes are captured during a rapid chemical reaction at interfaces between the redox-electrolyte and conducting layer, performing chemical reduction or oxidation reactions. The energy that is stored by the oxidation-reduction reactions is then tapped to draw off electrical power to an external load by running the reaction in a reverse direction, typically by using the conducting layer of the photoelectrode to collect current, or another current collecting electrode coupled with the counterelectrode.

A fundamental requirement for any commercially feasible photoelectrochemical cell is a photoelectrode which has a long operational lifetime. The limiting factor of the photoelectrode lifetime is usually photoelectrode corrosion, particularly anodic corrosion. Photoanodic corrosion is much more rapid than photocathodic corrosion because photocathodes are protected against oxidative corrosion by the photogeneration of electrons which arrive at the base semiconductor/redox-electrolyte interface. While reductive corrosion is possible, it is less likely to occur because reduction products (for example, hydrides) are less readily formed than oxidative products. The present invention overcomes both anodic and cathodic corrosion difficulties by means of a multilayer photoelectrode configuration. The preferred photoelectrode configuration comprises an appropriate base semiconductor, an insulator layer on the base semiconductor, and a conducting layer on the insulator layer wherein both the insulator and conducting layers are substantially continuous, pin hole free layers.

The base semiconductor absorbs light which generates hole-electron pairs. The insulator layer acts to diminish any reverse dark current flow across the photoelectrode, while still allowing tunneling of carriers in the forward direction, and also preferably is able to alter surface defects on the semiconductor to abate electronic states which have deleterious effects on solar cell efficiency. The outer conducting layer of the photoelectrode should be able to conduct efficiently the photogenerated electrical carriers and preferably also exhibit electrocatalytic properties.

Base Semiconductor

The base semiconductor preferably has a valence to conduction band optical gap energy such that a large portion of the electromagnetic spectrum incident on the photoelectrode semiconductor will result in creation of hole-electron pairs by photoexcitation of electrons from the valence to the conduction band. In the case of an electromagnetic spectrum from our sun, a desirable energy gap for the semiconductor is approximately 0.8 to 2.0 eV and preferably about 1.3 eV. Typical semiconductors and band gaps (in parentheses) which would be suitable for solar spectrum conversion include, but are not limited to, single crystalline, polycrystalline, and amorphous forms of: silicon (1.2 to 1.7 eV), GaAs (1.3 eV), Ge (0.78 eV), $B_4C$ (~0.5 eV), InP (1.25 eV), AlSb (1.6 eV), InSe (1.0 eV), ZnSe (2.6 eV), $Ca_2Si$ (0.9 eV), $Ca_2Sn$ (0.9 eV), GaSb (0.78 eV), GaP (1.8 eV), CdSe (1.74 eV), CdTe (1.45 eV), $Cu_2O$ (2.1 eV), $CuInS_2$ (1.4 eV), $CdSnP_2$ (1.2 eV), $CuAlSe_2$ (2.7 eV), $CdSnAs_2$ (0.3 eV) organic semiconductors, such as copper phthalocyanine (~2 eV), amorphous carbon (0.9–2.1 eV), and mixtures thereof.

It is also feasible to prepare photoelectrodes having at least two semiconductor layers in order to complement each other to utilize more of the incident electromagnetic spectral energy. For example, a first layer of Si has an optical gap of approximately 1.2 eV, and a second layer of Ge with a gap of 0.7 eV would absorb the longer wavelength radiation passed through a silicon layer of suitable thickness. The two semiconductors, together, would then convert a greater portion of the incident solar spectrum than just one silicon or germanium layer alone. The two, or more, semiconductor layers also should have some separating structure which would alleviate formation of structural defects due to lattice mismatch between the semiconductors. As is well known in the art, the intervening structure could be a chemically graded layer or a superlattice layer structure of the type disclosed in Blakeslee, U.S. Pat. No. 4,278,474, which is incorporated by reference. It is also feasible to have two or more base semiconductor regions with a redox-electrolyte solution interposed between the base semiconductors and thereby avoid difficulties associated with lattice mismatch. Further, such a redox-electrolyte solution is useful not only as a medium for a redox-couple reaction in an electrolyte solution, but also as a heat exchange fluid for utilization of energy converted into thermal energy by a photoelectrochemical cell.

The semiconductor preferably has an energy band structure relative to the insulator layer, the conducting layer, and the redox couple in the redox-electrolyte which results in obtaining the maximum power from the photoelectochemical cell. In an n-type semiconductor the Fermi level is near the conduction band, and one way to create a large potential energy barrier height at the junction between the semiconductor and insulator layer is to have: (a) an outer conducting layer with a work function higher than the base semiconductor work function, and/or (b) a redox couple in the redox-electrolyte with a chemical potential lower than the base semiconductor work function, and typically an oxidizing-type redox-electrolyte will satisfy this requirement. Herein the term "work function" is the definition well known to one of ordinary skill in the art, that is, the energy required to remove an electron from the Fermi level to vacuum with the particular material defined to be in isolation.

Since the volume of redox-electrolyte solution is much greater than the volume of the very thin outer conducting layer, the dominant influence on the potential energy barrier height usually will be the difference between the semiconductor work function and redox-electrolyte potential, provided the conducting layer and redox-electrolyte are effectively coupled by rapid redox reactions at the photoelectrode surface. Effective coupling means the Fermi level of the conducting layer is equal or comparable to the chemical potential of the solution, a situation aided by rapid kinetic exchange between the electrons in the conducting layer and the solution species. This effective coupling of electrolyte and conducting layer is typically accomplished by the presence of electrocatalytic properties in the conducting layer or by addition of a small amount of electrocatalytic material on the conducting layer. In the absence of effective electrocatalytic properties the potential energy barrier height of the photoelectrode will be dominated by the difference in work functions of the conducting layer and base semiconductor.

Additional interactions at the base semiconductor/insulator layer interface also will affect the photovoltaic output voltage. In the presence of fixed charges, which arise from chemical defects in the insulator layer, an additional energy barrier is induced in the photoelectrode. For example, in an n-type base semiconductor, if defects in the insulator layer have a negative virtual charge, a positive charge is induced in the base semiconductor which results in a potential energy barrier at the base semiconductor-insulator interface. Typical chemical defects which are capable of inducing such barriers include non-stoichiometric defects in the insulator, such as interstitials and/or vacancies on the anion or cation sublattices and substitutional defects arising from the presence of aliovalent ions.

Insulator Layer

In the instant invention the layer over the front face of the base semiconductor in the photoelectrode is an effective insulator layer. In order to be an effective layer the insulator layer should be thin enough that neither the transmission of electromagnetic radiation, nor the transport of charge carriers in the desired direction through the layer is significantly reduced. Upon illumination of the photoelectrode comprising an n-type base semiconductor, electrons are transferred from the redox-electrolyte into the photoelectrode accompanied by an oxidation reaction of species in the redox-electrolyte. The electrons pass through both the outer conducting layer and the insulator layer into the valence band of the n-type base semiconductor. The photoexcited electrons from the base semiconductor pass through the back contact via an ohmic contact to an external circuit, through the counter-electrode, and into the redox-electrolyte to complete the circuit.

The structure and properties of an effective insulator layer should therefore permit the passage of electrons from the face of the photoelectrode which is in contact with the redox-electrolyte, to the ohmic contact on the opposite face of the base semiconductor. The net current output is diminished by any dark current flowing in the reverse direction. Typically an oxide-type insulator layer of about 10 to 25 Angstroms thickness permits tunneling of electrons from the front face conducting layer across the insulator layer into the base semiconductor valence band wherein states have been left empty by the photoexcitation of electrons to the conduction band. The reverse dark current flow of electrons from the conduction band of the base semiconductor into the conducting layer is substantially reduced because electrons in the n-type base semiconductor are displaced from the insulator/semiconductor interface by the thickness of the charge depletion layer, typically hundreds of Angstroms. Consequently, the electrons have to tunnel this additional depletion thickness, and tunneling probability diminishes rapidly with tunneling distance; therefore, the reverse current flow is lowered by the presence of the insulator layer. This has the effect of increasing both the observed cell voltage and current.

In order to fulfill the above preferred operating characteristics for an effective insulator layer, the thickness of the layer should be well-controlled, and preferably substantially integral or pin hole free to be most effective. This is typically accomplished by having insulator layers of at least 5 Angstroms thickness. However, layers thicker than about 25 to 50 Angstroms do not allow adequate electron tunneling, the insulator acts as a blocking resistance, and the cell current drops. Various parameters characterize the precise thickness for a given configuration and materials which will yield effective insulator properties, while permitting tunneling in the desired direction. Effective thicknesses can be derived from the following works which are incorporated by reference: A. G. Milnes and D. L. Feucht, *Hetrojunctions and Metal-Semiconductor Junctions*, Academic Press, N.Y. (1970); and S. Roy Morrison, *Electrochemistry at Semiconductor and Oxidized Metal Electrodes*, Plenum Press, N.Y. (1980). In the more generic sense the fulfillment of the criterion for an effective insulator layer represents an improvement for a multilayer device configuration whether as part of a photoelectrode in a photoelectrochemical cell or, for example, as part of an MIS (metal/insulator/semiconductor) solid state device which for purposes of this disclosure can be defined as a photoelectrode in air (see Examples 9, 10, 13, and 21).

For the special case of native oxides on the base semiconductor, growth of native oxides to an effective insulator layer thickness can take as little as half an hour in air (silicon oxide on n-type silicon) or may never be achieved in air at ambient temperatures (silicon oxide on p-type silicon). Example 7 illustrates the substantial effect that time in air has upon the photoelectrochemical cell current output for an n-type, silicon base semiconductor. Exposure to air for about 2 minutes results in a cell current of about 21 ma/cm$^2$. An optimum air exposure time is approximately 12 to 25 minutes with a cell output of about 28 ma/cm$^2$, and a rapid decline to 8 ma/cm$^2$ cell output after an air exposure time of 50 minutes. Furthermore, for such materials as GaAs the native oxides have physical properties which are inadequate to provide effective insulator properties for the photoelectrode (see T. Hariu et al., Appl. Phys. Letters. 32, 252 (1978)). Therefore, preparation of a photoelectrode with an effective insulator layer of optimal thickness demands substantially more than formation of a native oxide layer of indeterminate thickness and unknown effectiveness. Moreover, non-native type insulators, which are deliberately fabricated on the base semiconductor, can constitute the insulator and provide for improved cell performance compared to the natural oxide. Examples are the combinations of $Si/Ta_2O_5$, $Ge/Al_2O_3$, $CdS/Si_3N_4$. The use of $Ta_2O_5$ on Si instead of $SiO_2$ on Si results in an increased cell voltage (see Example 18). The thin insulator layer is, for instance, deposited on the base semiconductor using chemical vapor deposition, electron beam deposition, or sputtering techniques. Combinations of native and artificial insulators are also possible.

A second type of non-native type insulator is a doped insulator, in which the deliberate introduction of impurity species is used to modify the fixed insulator charge and/or modify the surface states. An example is the alteration by doping of a native silicon dioxide with aluminum (see Example 5), achieved by coating the surface of the silicon base semiconductor with a small amount of an aluminum salt prior to oxidation. Another example is yttria doped zirconia deposited as the insulator layer with n-silicon as the base semiconductor (Example 21). Further, this type of insulator layer represents an improvement with more generic applications in devices such as MIS configurations described previously.

This multilayer photoelectrode (base semiconductor/insulator/conducting layer/redox-electrolyte) may be contrasted to a Schottky barrier device in which no intervening, integral insulator layer is present. Generally, in a Schottky device, the reverse dark current and forward current are much more nearly equal which would yield an undesirably small net voltage output for a Schottky configuration.

For our purposes, an insulator is defined to include all materials which, upon connection to a base semiconductor and a conducting overlayer, have the band gap of the insulator material encompassing the energy window through which the reverse dark current flows. For example, classical oxide insulators such as $Al_2O_3$, $SiO_2$, $MgO$, $MgAl_2O_4$, $Ta_2O_5$, $B_2O_3$, $ZrO_2$, $TiO_2$, rare earth oxides such as $Y_2O_3$, and lanthanides such as $CeO_2$ and $La_2O_3$, have wide band gaps which readily accommodate this definition. Other insulators can include nitrides, such as $Si_3N_4$ or BN, carbides such as SiC, and halides such as NaF or $PbCl_2$. All of the above may be either undoped, or doped so as to function as desired. Also included are selectively matched semiconductors with suitable widths for the band gap and even appropriate degenerately doped semiconductors, which include n+ with a p-type base semiconductor, p+ with an n-type base semiconductor. Also these conditions can be met for n+ with n-type and p+ with p-type, provided the degenerate electronic states or the bands are not in the energy window of the reverse dark currents. Certain appropriate narrow band metals, such as MnP, also fulfill the above requirement, i.e., the partly filled bands are narrow enough such that there is a band gap of sufficient width to encompass the dark current energy window (see J. B. Goodenough, D. H. Ridgley, and W. Newman, *Proc. Intl. Conf. Magnetism,* Nottingham, Int. Phys. and Phys. Soc., 1964). Also included are insulating organic materials such as polyethylene.

The insulator layer preferably also exhibits electronic and structural properties such that the number of detrimental interfacial electronic states at the base semiconductor/insulator junction is diminished by the presence of the insulator layer. For example, the surface of a typical semiconductor exhibits some atoms which have incomplete covalent bonds, i.e., dangling bonds. These dangling bonds have characteristic electronic orbitals which are at an energy level within the energy gap established between the valence and conduction bands of the base semiconductor. These intragap electronic states often assist in the recombination of electrons and holes created by the photoexcitation process, resulting in the loss of charge carriers and diminishment of overall photocell efficiency. Therefore, the insulator layer preferably acts to compensate, or to fulfill, the bonding needs of the incomplete or dangling bonds of the surface atoms. Compensating these bonds removes them from the energy band gap region and eliminates electronic states which otherwise would assist in the recombination of electrons and holes. The net result is an increase in both the carrier current and in carrier lifetimes.

In addition to dangling bond-type surface electronic states in the energy gap, other typical surface electronic states comprise: (a) grain boundary electronic states in a polycrystalline base semiconductor, (b) electronic states associated with dislocation line defects, and (c) electronic states formed by bonds between the base semiconductor and another element or compound which are weaker bonds than the self-bond of the base semiconductor, and therefore still lie in the band gap.

Typically, insulators which act to alleviate intergap states take the form of an oxide or nitride layer of the base semiconductor layer, since these bonds are usually at least as strong as the base semiconductor covalent self-bond energy. Examples include a silicon oxide or silicon nitride layer over an underlying silicon layer, or $In_2O_3$ on an InP base semiconductor. Compensating layers which do not have a common element with the base semiconductor can be beneficial as discussed above. These compensating layers include, but are not limited to, boron nitride, aluminum oxide, tantalum oxide, tin oxide, and titanium dioxide. Interfacial states also are abated by annealing in a hydrogen and/or fluorine gas atmosphere which acts to compensate defects such as dangling bonds (see Example 9).

Intragap electronic tunneling states also are capable of being created by various defects, such as grain boundaries, dislocations, impurities, and other free surfaces. Tunneling states are intragap states positioned in or near the depletion layer and energetically located near the positions of the valence and conduction band levels which define the energy gap. Some of these tunneling states lead to enhanced transport of majority carriers across the depletion layer. The flow of majority carriers across the depletion layer is undesirable in those cases in which one is seeking to minimize leakage currents arising from energy levels near the valence band or conduction band; for example, since the device is intended to function as a diode, (allowing current flow in one direction only) and the reverse dark current or leakage current is opposite the intended direction of current flow, then the tunneling states result in detrimental current and voltage outputs.

Higher cell voltages are achieved by doping the insulator to create charges in the insulator which induce complimentary opposite charges in the semiconductor, thus enhancing the voltage barrier. For p-type base semiconductors, such uncompensated virtual positive charges in the insulator will be compensated in the layers of the base semiconductor adjacent to the insulator, resulting in enhanced band bending and larger barrier heights. Pronounced band bending will produce an inversion to form a degenerate n+ region near the interface. In the first class of examples, the virtual positive charges are extrinsic dopant ions, such as interstitial $Na^+$ in $SiO_2$, or extrinsic substitutional aliovalent dopants such as $Nb^{5+}$ in $ZrO_2$, $Al^{3+}$ in MgO, $Mg^{2+}$ in NaCl, $F^-$ in $Al_2O_3$, or $O^{2-}$ ions in $Si_3N_4$. In the second class of examples, the virtual positive charges are intrinsic defects such as $Ni^{3+}$ ions in nickel oxide, or excess silicon in silicon dioxide.

For n-type base semiconductors, uncompensated virtual negative charges in the insulator will be compensated in the adjacent layers of the base semiconductor, resulting in enhanced band bending in the opposite direction compared to above. Large barrier heights will result from inversion to produce degenerate p+ layers near the interface. In the first class of examples, the virtual negative charges are extrinsic substitutional aliovalent dopants such as $Al^{3+}$ in $SiO_2$ (see example 5), $Y^{3+}$ ions in $ZrO_2$ (see Example 21), $Mg^{2+}$ ions in $Al_2O_3$, $Li^+$ in MgO, $Ti^{4+}$ in $Ta_2O_5$, $N^{3-}$ ions in $SiO_2$, $O^{2-}$ ions in NaCl, or carbide ions in $Si_3N_4$. In the second class of examples, the virtual negative charges are intrinsic substitutional aliovalent defects such as $Ta^{4+}$ ions in $Ta_2O_5$ (see example 18), $Ti^{3+}$ ions in $TiO_2$, $Fe^{2+}$ in $Fe_2O_3$, $In^+$ in $In_2O_3$, $Zn^+$ in ZnO, or excess interstitial ions such as $F^-$ in $CaF_{2+x}$ or $O^{2-}$ in $UO_{2+x}$.

In addition to enhancing the barrier heights, and thus the cell voltages, the minority carrier current through the doped insulator will be enhanced, and thus the cell current and voltage improved by the presence of dopant energy levels in the insulator which are within the energy window for minority carrier tunneling, thus allowing thicker insulators to be used. In the case of non-native oxides, several atomic layers of native oxide may also exist between the base semiconductor and the non-native insulator so as to reduce the surface state density and also assist in lattice matching of adjacent layers. Such improved multilayer diodes incorporating doped insulators are adaptable as photo cells in air when two electrical contacts are made to the front and back faces.

Conducting Layer

In a photoelectrochemical cell the photoelectrode layer adjacent the redox-electrolyte solution is an effective conducting layer. In order to be an effective conducting layer, the layer should be a good conductor of the electrical carriers, have a structure which will provide effective corrosion protection, preferably exhibit sufficient electrocatalytic properties to drive the redox reactions at an adequate rate, and should be thin enough to allow passage of a sufficient amount of electromagnetic radiation to permit efficient operation of the photoelectrochemical cell. If, however, the base semiconductor is illuminated from the opposite or back face, as in special configurations, then the thickness of the conducting layer on the front face is not limited by its transmissivity, and thick layers could be used. Provided this layer is of the appropriate thickness and sufficiently uniform to be substantially an integral layer, the layer will act to inhibit corrosion of the photoelectrode, will normally allow passage of light into the base semiconductor, will have sufficient electrical conductivity to enable the photo-induced charge carriers to traverse the layer without any significant carrier loss, and have substantial electrocatlytic character (see Modern Aspects of Electrochemistry, No. 12, Eds. J. O. M. Buckris and B. E. Conway, Plenum, 1977, p. 183–266). Typical preferred materials for this conducting layer include, but are not limited to: a noble metal like palladium, platinum, (it is preferable to anneal the photoelectrode configuration either during or after deposition of the platinum layer on the insulator layer (see Examples 1 and 19)) iridium, ruthenium, or tantalum, platinum silicide, $LaB_6$, and conducting amorphous carbon; semimetals, such as $MoSi_2$, $WSi_2$, and $CrB_2$; semiconducting chalcogenides or metallic pnictides, such as $MoS_2$ and TiN, respectively; degenerately doped semiconductors, such as $SnO_2$ doped with indium; doped oxides, such as $WO_3$, $MoO_3$, or $TiO_2$; and conducting organics, such as polypyrrole.

In those particular cases where the conducting layer does not have sufficient electrocatalytic activity to drive the redox reactions to produce a reasonable output for the cell (see Example 14), an electrocatalytically effective material (such as a noble metal, Ni, $RuO_2$, Mo, Ta, iridium tantalate, a nickel-molybdenum alloy, graphite or amorphous carbon and mixtures thereof) can be deposited over any general conducting layer of low electrocatalytic activity (see Examples 1, 13 and 22). Therefore in these particular cases an effective conducting layer for purposes of this disclosure becomes a general conducting layer region covered by a thin layer of electrocatalytically active material, such as a noble metal. Preferably the conducting layer is a thin layer of about 10 to 200 Angstroms of platinum, or an electrolytically inactive conducting layer such as non-stoichiometric $SnO_2$ or doped $SnO_2$ (of about 30 to several hundred Angstroms thickness) with several tens of Angstroms of platinum on the inactive conducting layer. The most preferred conducting layer is 10 to 50 Angstroms of platinum. (As explained in Example 1, all thicknesses determined in the evaporator unit by a deposition monitor are approximate and can be in error by a factor of two but are correct relative to one another.)

Electrolyte Solution

The electrolyte is preferably aqueous, but other redox-electrolytes which conduct ionic currents and contain a redox potential appropriately matched to the band structure of the multilayer photoelectrode are also suitable redox-electrolytes. Nonaqueous electrolytes which are suitable include polar solvents, such as ethanol and methanol, having appropriate ionic conductors in the solvent. In the typical configuration for a photo-electrochemical cell wherein light passes through the redox-electrolyte to the photoelectrode, the redox-electrolyte also is preferably substantially transparent. In an aqueous redox-electrolyte preferred redox couples are $I_2/I^-$ and $Br_2/Br^-$ with the work function of the base semiconductor matched with the redox potential of the redox-electrolyte. This is, however, not necessary in those cases where the fixed charge of the insulator layer determines the barrier potential energy of the photoelectrode. Another suitable redox-electrolyte is a fused salt, such as aluminum chloride with n-butyl pyridinium chloride. This redox-electrolyte is particularly preferred when n-type GaAs is the base semiconductor. The preferred redox couple in this case is iron dicyclopentadienyl-iron dicyclopentadienyl chloride. In the case of an organic redox-electrolyte an example is acetonitrile and iodine/iodide as the preferred redox couple. In a particular type of photoelectrochemical cell one or all of the redox components can be gaseous, rather than liquid, as for example in a photoelectrolysis cell.

The ability to use a redox-electrolyte to form a diode junction with the multilayer photoelectrode also enables the preparation of a photoelectrochemical cell which is inoperable in air without the redox-electrolyte. In this case, a contact wire is joined to the conducting layer, and the voltage and current are recorded between this wire and the normal back face contact, enabling the photoelectrode to be tested in air. For example, when using p-type silicon as the base semiconductor, it is necessary to have a low work function, conducting layer over the base semiconductor in order for the photoelectrode to have the proper potential energy barrier relationships to be functional in air. However, appropriate low work function conductors, such as Cr, Cu, Al, and Mg, all quickly corrode when placed in a redox-electrolyte solution and thus render the photoelectrode inoperative. Due to the presence of a redox-electrolyte in this invention, a high work function, conducting layer such as Pt can be placed over the base semiconductor, and a low work function redox-electrolyte solution (such as a reducing solution of $V^{3+}/V^{2+}$ or $S^{2-}/S_n^{2-}$ (polymeric form)) can be used to produce an operative photoelectrode using p-type silicon (see Example 14). Without the low work function redox-electrolyte this photoelectrode would be inoperative in air since a high work function, conducting layer is over a p-type base semiconductor, and the potential energy barrier would not permit current flow.

Ohmic Contacts

Figure 1:
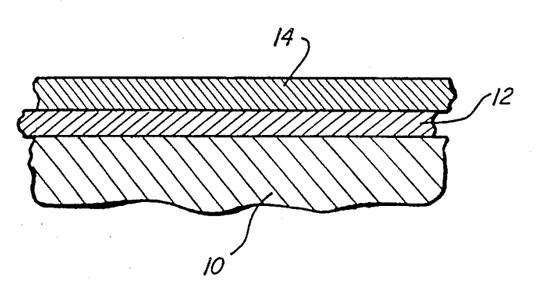

Completion of the electrical circuit of the photoelectrochemical cell requires at least a wire from the counterelectrode joined to the back face of the base semiconductor of the photoelectrode by means of an ohmic contact. The ohmic contact to the base semiconductor may be formed by a variety of ways known to those of ordinary skill in the art. However, in this invention a new, improved contact to n-silicon was preferably formed by depositing on the back face of the base semiconductor the following layers: a first layer of phosphide, arsenide, or antimonide, followed by a second metal layer, and then a final conducting layer. The drawing is illustrative of this type of ohmic contact to a base semiconductor. Referring to the drawing, a layer 12 of phosphide, arsenide, or antimonide is interposed between the base semiconductor 10 and a conducting layer 14. The phosphide, arsenide, or antimonide layer is a compound with a metal cation which is capable of forming a conducting metal oxide compound with any underlying oxide compound (such as native oxides). Examples of cation candidates include Ti, Zr, Hf, V, Nb, Ta, and other metals enumerated in the publication by A. T. Howe and P. J. Fensham, Quart. Rev. 21, 507 (1967) which is incorporated by reference. In a more generic sense the second metal layer is not required if the first layer of phosphide, arsenide, or antimonide is thick enough to take up all the oxygen from any underlying native oxide or deposited oxide layer. The final conducting layer is a conducting material stable in air, and not reactive with the underlying layer, for example, Pt, Pd, Au, W, Ta, $MoSi_2$, doped $SnO_2$, doped oxides, such as $WO_3$, or conducting organics such as polypyrrole. The most preferred embodiment comprises layers of vanadium phosphide, titanium, and platinum on the back face of the base semiconductor. Since the metal layer on the phosphide, arsenide, or antimonide layer takes up oxygen to form a conducting oxide, an ohmic contact is formed without the necessity of removing any oxide layers from the base semiconductor surface. One of the main difficulties in making ohmic contacts to any semiconductor is invariably the presence of native oxides, or other unwanted oxide layers on semiconductors which have been exposed to an oxidizing atmosphere. In the present invention for the particular case of n-type silicon as the base semiconductor, the silicon had accumulated approximately 10 Angstroms of native oxide, and the deposition of vanadium phosphide, titanium, and platinum layers resulted in formation of suitable ohmic contacts of several ohms resistance (see Examples 1 and 16).

In the production of an ohmic contact in the instant invention the vanadium phosphide layer performs two important functions: (1) it provides a source of phosphorous to form the n+ degenerately doped layer of silicon, and (2) it provides a source of vanadium to reduce surface oxides and form a conducting vanadium oxide layer. Any excess vanadium phosphide will also be conducting since the material is a metallic conductor, and as indicated previously, any excess oxygen is accommodated by reaction with the reducing metal layer between the vanadium phosphide and the protective outer metal layer to form a conductive oxide.

In the present invention other suitable materials for making ohmic contacts to n-type semiconductors are metal hexaborides on the semiconductor and any air stable conducting layer on the hexaboride. Preferably the layer on the base semiconductor is one of the lanthanide borides, and most preferably is lanthanum hexaboride. Metal hexaborides with a +3 oxidation state and some with a +1 oxidation state exhibit metallic conductivity. The metal hexaborides provide a low work function ohmic contact to n-type semiconductors in general and also can be used as an ohmic contact to photovoltaic Schottky barrier devices composed of p-type semiconductors. Further, most organic semiconductors are p-type and thus require a low work function metal for a Schottky barrier photovoltaic device. In a photoelectrochemical cell, lanthanum hexaboride provides a material transparent to visible and ultraviolet light, has suitable conductivity, forms an ohmic contact to the base semiconductor, and shows good resistance to corrosion which is essential for long-term stability in a photoelectrochemical cell with an n-type base semiconductor as the photoanode. The ohmic contact is then formed by deposition of the hexaboride on the n-type base semiconductor, followed by deposition of a metal layer on the hexaboride, such as platinum, and then silver paste and a copper wire are attached to the metal layer. A preferred configuration in the instant invention is an integral layer of at least 20 Angstroms of $LaB_6$ and several hundred Angstroms of platinum (see Example 17).

Additional Embodiments

The multilayer structure in the generic sense constitutes a diode in which an internal voltage barrier allows current flow more in one direction than the other, and such a diode is incorporated in the photoelectrode. Other devices which incorporate such a diode configuration are: (a) a photocell in which electrical connections are made directly to the back and front of the diode structure, (b) a photodiode, in which the diode properties are dependent upon the characteristics of the incident light spectrum, (c) a dark diode acting as an electrical rectifier, (d) a photocapacitor device, (e) a dark capacitor device, and (f) an electrode in which the diode barrier height depends on the redox potential of the medium surrounding the diode, and in which the potential energy barrier height is measured directly (or indirectly as in a field effect device), to indicate redox potentials of the surrounding fluids.

More particularly, there are several other particular embodiments which the present invention incorporates using the same basic principles of operation as the photoelectrochemical cell described above. One of these different embodiments comprises a photoelectrochemical cell with the photoelectrode undergoing illumination from the direction of a dry back face, rather than radiation passing through the redox-electrolyte solution and striking the photoelectrode front face. Such a configuration has the advantage that the incident radiation does not have to pass through the redox-electrolyte solution. Therefore, thicker front face conducting layers can be used for the photoelectrode; and the redox-electrolyte solution can be opaque to the incident radiation, thereby allowing a broader choice of redox-electrolyte solutions. Furthermore, the photoelectrochemical cell components are capable of being enlarged on the front face since these components need not be transparent to the radiation. For example, the counterelectrode may be attached to the front face with appropriate insulation, membranes can be mounted, and various current-collecting electrodes and monitors attached. However, the back, dry face ohmic contact and the base semiconductor should be sufficiently transparent to allow absorption of most of the incident radiation by the base semiconductor. Suitable means to fulfill these requirements include using current collection by a fine grid of opaque metal or using a transparent conductor as the current collector, such as doped $SnO_2$. If the base semiconductor thickness is too large, current collection efficiency will diminish due to recombination of holes and electrons before the carriers diffuse through the base semiconductor to the front face diode region where holes and electrons are separated. For example, doped $SnO_2$ current collectors can be deposited on a protective glass plate with the base semiconductor deposited on the doped $SnO_2$, followed by a layer of insulator, and then a conducting material layer adjacent the redox-electrolyte solution. During actual use such a configuration can be mounted on the outside of a building roof with light striking the back face covered by the glass plate.

In another configuration of the present invention, light is also incident on the back face of the photoelectrode. The back face materials need to be substantially transparent, and light then passes through to the base semiconductor with some light absorbed and some passing on to the conducting layer. The conducting layer provides a reflective surface whereby the light is reflected back into the base semiconductor, and therefore some of the light passes back through the base semiconductor with twice the path length available for light to be absorbed. This configuration utilizes the reflective properties of the conducting layer, and the thickness of the base semiconductor can be reduced.

In another aspect of the present invention situations occur in which one of the electrodes, counterelectrodes or photoelectrodes is replaced by the other type of electrode. For example, a counterelectrode can be replaced by a photoelectrode such that the band gaps of the two resulting photoelectrodes are different. The two photoelectrodes are separated by a redox-electrolyte, or two redox-electrolytes with an intervening membrane. Light components of high energy are absorbed by the first photoelectrode, and the remaining lower energy light passes on to be absorbed in the second photoelectrode. Using the ion conducting membrane to separate two solutions of different redox battery, the two photoelectrodes can be used to charge up the redox battery. The conductor layer of the multilayer configuration acts as a current collector as well as functioning as an essential part of the photoelectrode. Electrical connections to this conductor layer of each photoelectrode are used for the following:

(a) direct collection of electrical output from the cell rather than battery charging when illumination is adequate, (b) direct collection of electrical output when the battery is fully charged, and (c) collection of electrical power during discharge of the battery and no additional counterelectrodes are necessary.

An additional aspect of the present invention is a photoelectrolysis cell, (which is a particular type of photoelectrochemical cell), comprising one or more gas phase redox components which replace the solution redox components of the photoelectrochemical cell with the provision that ionic conduction is still accomplished between the two electrodes of the cell. In one configuration water, HBr, or HI are electrolysed between a photoelectrode and a counter electrode immersed in an electrolyte containing the reactants, and hydrogen gas plus the other decomposition products are produced. In another configuration the photoelectrolysis of water is done using two plate photoelectrodes having different optical band gaps, arranged to absorb successively the light components. This basic configuration is retained in another example except that the two photoelectrodes are connected by a sheet of porous material which conducts protons from one electrode to the other. Water vapor is passed through the porous separator and is converted at each photoelectrode face into either hydrogen or oxygen. Another photoelectrolysis configuration comprises two photoelectrodes of different band gap connected by a proton conducting medium, and water vapor is passed over the outside face of each photoelectrode with protons reaching the outside faces of the photoelectrodes through pores or holes in the photoelectrodes. Photoelectrolysis proceeds and produces hydrogen and oxygen gas.

EXAMPLE 1

In the examples that follow the starting materials for the base semiconductors are silicon single-crystals, (100) orientation, approximately 1 inch diameter wafers supplied by Atomergic Chemicals Corporation. These wafers were cut into smaller sizes for preparation of photoelectrodes. The crystal in this example was n-type, phosphorus doped, with a resistivity of 1.0 ohm centimeters. The polished face of the crystal was placed face down and a drop of etchant placed on the unpolished face which was etched twice for two minutes each time with a 10 volume percent HF/36 volume percent $NH_4F$ aqueous solution and then washed with distilled water for 30 seconds. The crystal was then dried under ambient conditions with a flowing nitrogen gas stream.

Back ohmic face contacts on the base semiconductor were fabricated as follows: A platinum slug, titanium slug, and vanadium phosphide pellet were placed in separate carbon crucibles, and all three of the crucibles placed in a Balzers electron beam evaporator. The evaporator vessel was pumped down to a pressure of $10^{-5}$ millibars pressure. The aluminum substrate holder to which the silicon crystal was attached was heated by a resistive heater positioned in the top of the vacuum chamber. The temperature was raised to 465° C. over a one-half hour time period, and the substrate holder was continuously rotated. The temperature during deposition was monitored with a chromel-alumel thermocouple placed in contact with the upper side of the aluminum substrate holder of the evaporator unit. Electron beam evaporation of the materials in the crucibles proceeded in the following order: About 150 Angstroms of vanadium phosphide was deposited on the back face of the base semiconductor; approximately 1,000 Angstroms of titanium was then deposited on the vanadium phosphide, and about 500 Angstroms of platinum was deposited on the titanium. The thickness of these layers was measured by a vibrating quartz crystal monitor which had been calibrated by deposition of layers and measurement of layer thicknesses from an Auger ion beam depth profiling experiment. Therefore, all thickness figures in the examples are expressed as monitor readings which are approximately one half the actual thickness. After deposition, the heat was turned off, and the silicon crystal was allowed to cool to room temperature in the evaporation unit under vacuum at $10^{-4}$ millibars pressure. The crystal with the deposited layers thereon was taken out of the evaporation unit, and the polished face was etched for four minutes with the previously mentioned HF-ammonium fluoride etching solution. The crystal was then washed with deionized water for 30 seconds on both sides and dried with a flowing nitrogen gas stream at ambient conditions. The crystal was then allowed to sit in air for 25 minutes to grow an oxide layer before loading again into the evaporation unit.

Depositions were carried out on the front face of the crystal by placing the crystal on the aluminum substrate holder, back-face down, and the evaporation unit was pumped down to $10^{-5}$ millibars pressure. An alumina crucible contained a pressed pellet of $SnO_2$, and electron beam evaporation of the $SnO_2$ from the material in the carbon crucible gave a thickness of about 100 Angstroms of $SnO_2$ on the front face of the base semiconductor crystal. After evaporation the crystal was removed from the evaporation unit, placed in an aluminum oxide boat, and the assembly was placed in a quartz tube. The quartz tube was pushed into a Lindberg tube furnace wherein the temperature was raised to 338° C. in 15 minutes in an air atmosphere, and the specimen was allowed to anneal for 1½ hours. The furnace was turned off, and when the furnace was at 100° C., the quartz tube and sample were lifted out of the furnace and allowed to cool to room temperature. A control deposit of $SnO_2$ on a glass slide was also annealed along with the crystal, and after annealing the resistivity had dropped significantly, and the film had become substantially transparent. The crystal was then returned to the evaporation unit, and the unit pumped down to a pressure of $10^{-5}$ millibars pressure.

The aluminum holder in the evaporator was heated to a temperature of 100° C. over a 15 minute interval, and platinum was electron beam evaporated onto the specimen from a platinum slug held in a carbon crucible. The platinum was deposited to a thickness of about 8 Angstroms at a rate of 0.2 Angstroms per second onto the $SnO_2$ layer which was on the base semiconductor. Platinum was also deposited on a control glass slide; and a resistivity value of 1,880 microohm centimeters was determined for the Pt layer by two-point probe techniques using indium strip contacts. The light transmission was also measured for the platinum on the glass slide and a transmission of 87.8 percent was determined by comparing the known amount of unattenuated light incident on a standardized silicon solar cell used as a detection device.

After platinum evaporation onto the crystal the edges of this silicon crystal were chopped off using a straight edge placed against the crystal surface and striking the straight edge with a hammer. The removal of crystal edge material avoided a short between the front and back face. A 28 gauge silver coated copper wire was then attached to the back face of the photoelectrode by placing high purity silver paste on the face and attaching the wire to the silver paste. The resulting photoelectrode was placed onto a glass slide with the polished face of the silicon crystal facing up, and Dow Corning 100 percent black silicone rubber was used to seal the cell to the glass slide. The edges of the crystal were overlapped with sealant to prevent redox-electrolyte penetration. The cell was placed in a 0.02 molar (5 gram per liter) $I_2$, 0.4 molar (60 grams per liter) NaI, 0.5 molar KCl (37 grams per liter) aqueous solution and was tested at 1 sun illumination. A standard of 1 sun illumination was determined by calibrating a solar cell obtained from Allied Chemical Corporation. This cell was calibrated against a cell obtained from Solarex Corporation having a known solar cell sensitivity. An EKE projector lamp was placed in an Ealing fiber optics light source unit, and a ⅛ inch optical fiber outlet was made to a 1 inch focal point lens. This system gave a parallel beam of light incident upon the subject photoelectrode in a beaker which contained a quartz window through which the light passed to the photoelectrode. The solution in the beaker was mechanically stirred, and the cell was fastened to the side of the beaker and positioned 0.5 centimeters from the quartz window through which the light was passed.

The short circuit current was measured with minimum resistance in the circuit by means of an ammeter with less than 1 ohm internal resistance. The open circuit voltage was measured with a voltmeter having $10^7$ ohms internal resistance. The shunt resistance was measured under reverse biased conditions between 0 and $-0.6$ volts, or lesser volts, wherever there was a suitable linear range. The series resistance was measured at forward bias at the linear part of the current voltage curve with the bias typically being 0.3 volts, or approximately near open circuit voltage. The efficiencies were calculated by taking voltage and current values at the tangent parallel to the line joining the open circuit voltage and short circuit current. The product of this set of values of voltage and current divided by the incident power yield the efficiency. The fill factor is the product of the voltage and current at the tangent parallel to the line joining the open circuit voltage and short circuit current divided by the product of the open circuit voltage and the short circuit current.

At 1 sun illumination various characteristic parameters were measured. The area of the cell was 0.32 cm². A short circuit current of 4.8 milliamps and an open circuit voltage of 0.32 volts were determined. A shunt resistance of 3.5 k ohms was measured from the reverse bias characteristics. The resulting efficiency was 1.3 percent and the fill factor was 0.24. The cell ran for a total of 51 (and was still running at time of application date) complete days under 1 sun illumination in the iodide/iodine solution.

EXAMPLE 2

The procedure of Example 1 was repeated to produce an ohmic contact on a wafer of resistivity 8 to 25 ohm cm, except the temperature during deposition of the layers was 435° C. The front face was etched as in Example 1 and was then washed with 0.01 molar tin chloride solution (tin chloride from Purtronic Corporation) for 20 seconds, washed with deionized water, and dried with a nitrogen gas stream. The specimen was then oxidized in air for 25 minutes, placed in the Balzers evaporation unit, pumped down to $10^{-5}$ millibars pressure, and heated to 112° C. over a one-half hour time period. A layer of platinum of about 8 Angstroms thickness was deposited over a 30 second time period on the front face of the photoelectrode. The resistivity of an accompanying platinum film evaporated on a glass slide was 3,500 microohm centimeters with a light transmissivity of 76.5 percent. The specimen area under illumination was 0.2 cm$^2$. The short circuit current was 21.7 milliamps/cm$^2$, the open circuit voltage was 0.36 volts, the efficiency was 2.6 percent, and the fill factor was 0.30. The cell lasted for a total of approximately six days in the iodide/iodine solution at 1 sun illumination, after which the device deteriorated rapidly.

EXAMPLE 3

Example 3 was prepared as Example 2 except the front face of the semiconductor was oxidized for 3 minutes in air after the etching treatment. The specimen was placed in the evaporation unit, pumped to a pressure of $10^{-5}$ millibars pressure, and the specimen held at a temperature of 92° C. while Pt was electron beam evaporated onto the front face to a thickness of about 10 Angstroms over a 5 minute time period, after which the specimen was cooled to room temperature in vacuum. An accompanying glass slide was coated with platinum, and a resistivity of 1,300 microohm centimeters and a transmissivity of 68.5 percent were measured. At 1 sun illumination and an illuminated specimen surface area of 0.12 cm$^2$ the short circuit current was 2.8 milliamps, the open circuit voltage was 0.34 volts. After 1¾ months in solution with occasional testing, the short circuit current decreased to 1.0 milliamps, and the open circuit voltage was 0.35 volts.

EXAMPLE 4

In this example an n-type silicon single crystal had a resistivity of 6 to 12 ohm centimeters, and was phosphorous doped. The back unpolished face of the single crystal was etched 30 minutes with a 10 percent HF/36 percent NH$_4$F solution and washed with deionized water. The crystal was placed in the evaporation unit with the back face exposed, and the unit was evacuated to $10^{-4}$ millibars pressure. Lanthanum hexaboride was electron beam evaporated from a target pellet, and a LaB$_6$ layer of approximately 1,000 Angstroms thickness was deposited. The substrate holder was not rotated during deposition. Next, a layer of about 5,000 Angstroms of platinum was electron beam evaporated onto the lanthanum hexaboride layer. The specimen was removed, the front polished face was etched for 1 minute with 10 percent HF,/36 percent NH$_4$F solution, washed with deionized water, dried in a nitrogen gas stream, and allowed to sit in air for 20 minutes. The front edges of the crystal were then masked off with tape, and the silicon crystal was placed in the evaporation unit with the front face exposed. The evaporation unit was pumped down to $10^{-4}$ millibars pressure, and about 200 Angstroms of platinum was deposited on the front face of the crystal. After 15 minutes the specimen was taken out, and the edges were trimmed and a back contact with silver paste and copper wire was made as in Example 1. The front face of the cell was sealed to the glass slide with Devcon 5 minute epoxy. The cell underwent illumination and testing in a glass beaker using a 1¼ inch optical fiber and an Ealing fiber optic light system to illuminate the front face of the photoelectrode. After 35 continuous days in the iodide solution used in Example 1, and at an illumination of 1.5 suns, the epoxy had deteriorated so the specimen was then removed from solution, washed with distilled water and epoxied again around the edges where the old epoxy had cracked. The area of the illumination was originally 0.5 cm$^2$, and after reepoxying the area was 0.25 cm$^2$. After 59 days the epoxy cracked again. The specimen was resealed using Dow Corning 100 percent silicone rubber caulk (white) and was retested under the same illumination conditions. At the beginning of the cell lifetime the illumination area was 0.5 cm$^2$ and the cell had an output current of 4.7 milliamps and an open circuit voltage of 0.32 volts. The short circuit current was 6.0 milliamps after 43 days with an illumination area of 0.5 cm$^2$. After 61 days the cell had an output of 1.7 milliamps current and 0.31 volts with an illumination area of 0.25 cm$^2$. After 278 days the current was 1.1 milliamps, after 316 days it had decreased to 0.30 milliamps, and after 346 days the output was 0.03 milliamps and 0.34 volts. The efficiency was determined to be approximately 1 percent for this cell throughout the first 273 days of operation.

EXAMPLE 5

This specimen received the same back face treatment as Example 1. After deposition of the back face ohmic contact, the front face was etched two times with 10 percent HF/36 percent NH$_4$F solution for 2 minutes, and then was washed with an aluminum containing solution prepared as follows: a solution of 10 milliliters ethanol and one drop of Al-S-butoxide (95 percent) was mixed and centrifuged, and the supernatant liquid was decanted, to which was added an additional 10 milliliters ethanol. Approximately 1 milliliter of this solution was added to another 10 milliliters ethanol and used to wash the crystal for approximately 30 seconds, and the solution was evaporated with a stream of nitrogen gas. The specimen was allowed to sit in air for 25 minutes to form a doped oxide layer and then was placed in the evaporation unit with the front face of the device exposed. The evaporation unit was pumped down to $10^{-5}$ millibars pressure and heating was commenced. When at 100° C. for about one-half an hour, platinum was electron beam deposited as in Example 1. A total of about 8 Angstroms platinum was deposited over a period of 30 seconds, the heat was turned off, and the specimen allowed to cool to room temperature over one half hour time period. The accompanying glass slide with platinum deposited thereon showed a platinum film resistivity of 3,190 microohm centimeters and 84.4 percent transmissivity of light. The specimen was then made into a photoelectrode by attaching silver paste and a copper wire as in Example 1. The specimen was placed in the Lindberg tube furnace with a hydrogen atmosphere passed over the specimen which was heated to a temperature of 200° C. as measured by a chromel-alumel thermocouple adjacent the specimen. The temperature was held at 200° C., and a hydrogen gas atmosphere was maintained over the specimen for 16 hours, after which the specimen was allowed to cool in the oven to room temperature. The specimen was placed in the photoelectrochemical cell solution with the electrolyte solution of the same composition as in Example 1. At 1 sun illumination the output was 6.8 milliamps and 0.42 volts for an area of 0.35 cm$^2$. Subsequently, the specimen was tested in a concentrated I$_2$/I$^-$ solution with the maximum amount of iodine in solution. At ½ sun illumination a voltage of 0.24 volts was measured and a current output of 4.4 milliamps was determined for an area of illumination of 0.35 cm$^2$. The efficiency was determined to be 6.6 percent, the series resistance was approximately 23 ohms and the shunt resistance was greater than 10 k ohms.

EXAMPLE 6

The base silicon semiconductor had a resistivity of 8 to as much as 25 ohm cm. An ohmic contact was made as in Example 1. The front face of this specimen was swabbed with a dry Q-tip to remove dust particles and then allowed to oxidize a period of 10 minutes in air after carrying out the same etching operation of Example 1. Ten Angstroms of Pt were electron-beam deposited on the front face at 0.02 Angstroms per second at 110° C. and 10$^{-6}$ mbar pressure. A control slide gave a Pt resistivity of 580 microohm and a transmissivity of 69 percent. This specimen was placed in an aluminum oxide boat, placed in the Lindberg tube furnace, and purged with a 1 percent H$_2$/Ar atmosphere for a period of 15 minutes. The specimen was heated over a one hour period to 300° C., left for a period of 16 hours at 300° C., and cooled to room temperature over 2 hours, purging continuously with the H$_2$/Ar gas atmosphere. The specimen was sealed with the Dow Corning silicone rubber as in Example 4, and the resulting photoelectrode was immersed in a solution of 1 molar sodium iodide, 0.1 molar I$_2$, and 0.2 molar KCl in hydrochloric acid such that the pH of the solution was unity. The specimen was then illuminated as in previous examples by a parallel light beam, and the short circuit current was 0.18 milliamps, and the open circuit voltage was 0.40 volts.

EXAMPLE 7

The preparation of Example 7 was the same as Example 6, except four different times of air oxidation of the front face after etching were employed: 2 minutes, 10 minutes, 25 minutes, and 50 minutes. These specimens were put in the evaporation unit, pumped to a pressure of 10$^{-5}$ millibars pressure, and were heated for a period of one-half hour to 110° C. Each of these four specimens had about 10 Angstroms of platinum deposited at a rate of 0.02 Angstroms per second, reaching a total thickness of about 10 Angstroms of platinum. The accompanying glass slide with platinum deposited thereon showed a resistivity of 580 microohm centimeters and a 60.9 percent transmissivity of light. The samples were tested at 1 sun illumination in the same iodide-iodine solution used in Example 6. The four specimens subjected to different times of oxidation showed the following short circuit currents and open circuit voltages: for 2 minutes oxidation the short circuit current was 22 milliamps/cm$^2$ and 0.36 volts open circuit voltage, with an area of illumination of 0.12 cm$^2$. For the specimen subjected to 10 minutes air oxidation the short circuit current was 27 milliamps/cm$^2$ and an open circuit voltage of 0.36 volts, with an area of 0.21 cm$^2$. For the specimen subjected to 25 minutes oxidation the short circuit current was 27.5 milliamps/cm$^2$ and the open circuit voltage was 0.36 volts for an area of 0.16 cm$^2$. The specimen oxidized for 50 minutes showed a short circuit current of 7 milliamps/cm$^2$ and an open circuit voltage of 0.35 volts, with an area of 0.18 cm$^2$. The efficiency of the specimen oxidized for 25 minutes was approximately 3 percent.

EXAMPLE 8

The preparation of the back contact of this Example was the same as Example 1, and the preparation of the front face was the same as Example 7, except three specimens were prepared with oxidations lasting for 2 minutes, 10 minutes, and 25 minutes. These three specimens were then transferred to the evaporation unit and pumped down to a pressure of 10$^{-5}$ millibars pressure, heated to 100° C. over a period of one-half hour, and 10 Angstroms of platinum were deposited on each of the specimens at a rate of about 0.25 Angstroms per second. The glass slide with the accompanying platinum film showed a resistivity of 440 microohm centimeters and a light transmissivity of 66.1 percent. These three specimens were made into photoelectrodes, immersed in the iodide-iodine solution used in Example 7, and tested at 1 sun illumination. The specimen oxidized for 2 minutes showed a short circuit current of 20.0 milliamps/cm$^2$ with an open circuit voltage of 0.37 volts for an area of 0.08 cm$^2$. The specimen oxidized for 10 minutes showed a short circuit current of 24.2 milliamps/cm$^2$ with an open circuit voltage of 0.37 volts and an area of 0.12 cm$^2$. The specimen oxidized for 25 minutes showed a short circuit current of 26.5 milliamps/cm$^2$ and an open circuit voltage of 0.37 volts, with an area of 0.20 cm$^2$.

EXAMPLE 9

This specimen was prepared the same as Example 5, except hydrogen gas was brought into the Balzers evaporation unit at a pressure of 0.1 atmosphere, and the specimen was annealed at 385° C. for one-half hour, the heating unit turned off, and the specimen allowed to cool to 100° C. over a one hour time period. The specimen chamber was then pumped down to 10$^{-5}$ millibars pressure and 8 Angstroms of platinum were deposited on the front face of the semiconductor. The accompanying glass slide with a platinum film deposited thereon showed a resistivity of 3,050 micro-ohm centimeters and a 78.1 percent light transmissivity. The edges of the cell were cut off as in Example 1, and a contact made to the front face using a thin wire and silver paste, but leaving a large area uncovered for illumination. The contact was covered with sealant, and the specimen was immersed in the iodide-iodine solution used in Example 1. With an area of 0.25 cm$^2$, the photoelectrode front face was illuminated at 1 sun illumination. A short circuit current of 5.9 milliamps, an open circuit voltage of 0.34 volts, and an efficiency of 3 percent were measured. The series resistance was 51 ohms, and the shunt resistance was approximately 2 k ohms. The cell was then taken out of solution, illuminated in air, and the same parameters measured. With 1 sun illumination from an optic fiber, of 0.07 cm$^2$ area, up against the front face of the cell, a short circuit current of 0.17 milliamps and an open circuit voltage of 0.18 volts were measured. The series resistance was 20 ohms, and the shunt resistance was 2 k ohms.

EXAMPLE 10

An n-type silicon wafer of 8 to 25 ohm cm resistivity was used in this example. The back face ohmic contact was prepared by a well-known method using an Emulsitone phosphorosilica film: the Emulsitone phosphorosilica film was lightly brushed onto the center of the back face of the crystal, allowed to dry in air, and then placed in a ceramic boat. The specimen was heated in a large Lindberg-type tube furnace using Ar/N$_2$ mixture as a purge gas. The specimen was gradually pushed in so as to be at 100° C. for 5 minutes, and then at 800° C. for 1 minute, and then held at 1,075° C. for 15 minutes. The specimen was removed from the furnace over a period of one-half hour, and the back face was etched for 5 minutes in 10 volume percent HF/36 volume percent NH$_4$F aqueous solution. The solution was changed three times during that 5 minute time period. The specimen was washed in nanopure deionized water supplied by Sybron/Barnstead, with the water resistivity being about 8 to 12 megaohm centimeters. The crystal remained in air for a total of 45 minutes, after which time the crystal was re-etched on the back face for seconds with the HF-NH$_4$F solution, washed with deionized water for 45 seconds, and then washed with nanopure water until the surface conductivity of the specimen stabilized. The specimen was dried with nitrogen gas, placed in the evaporation unit, and pumped to $10^{-5}$ millibars pressure. Approximately 1,000 Angstroms of titanium were deposited on the specimen, followed by deposition of about 1,000 Angstroms of platinum. The specimen was removed to air for 15 minutes, etched with the HF-NH$_4$F solution for 30 seconds, washed with deionized water for 45 seconds, followed by a nanopure water washing, and drying with nitrogen gas. After this washing operation, the specimen was immediately placed in the evaporation unit and approximately 17 Angstroms of SiO$_2$ were deposited by electron beam evaporation from a silicon dioxide pellet. Over a 10 minute time period 100 Angstroms of platinum were deposited on the silicon oxide layer while maintaining the specimen at 150° C. The photoelectrode was made up and tested in air as in Example 9. With 1 sun illumination on an active area of 0.07 cm$^2$, the short circuit current was 0.46 milliamps, and the open circuit voltage was 0.21 volts. The series resistance was 3.3 ohms, and the shunt resistance was 840 ohms. The specimen of area 0.5 cm$^5$ was immersed in the iodide-iodine solution used in Example 1, and illuminated at 1 sun intensity. The short circuit current was 5.1 milliamps, and the open circuit voltage was 0.42 volts. The series resistance was 26 ohms, and the shunt resistance was 2 k ohms.

EXAMPLE 11

In this Example three specimens with different base semiconductor resistivity were tested, and preparation and testing were the same as Example 2. The first specimen had a resistivity of 1.0 ohm centimeters, the second a resistivity of 0.1 ohm centimeters, and the third had a resistivity of 8 to 25 ohm centimeters. The first photoelectrode specimen had an illumination area of 0.45 cm$^2$. A short circuit current of 9.1 milliamps and open circuit voltage of 0.34 volts was determined. The second specimen with an area of 0.36 cm$^2$ had a short circuit current of 7.1 milliamps and an open circuit voltage of 0.35 volts. The short circuit current density was 19.7 milliamps/cm$^2$, and the saturated current density was 22.8 milliamps/cm$^2$. The third specimen with 8 to 25 ohm centimeters resistivity, with an area of 0.24 cm$^2$, had a short circuit current of 5.2 milliamps and an open circuit voltage of 3.6 volts.

EXAMPLE 12

A silicon crystal the same as used in Example 2 was used in this Example. The back face contact consisted of the same type of contact as prepared for Example 1, with about 150 Angstroms of vanadium phosphide deposited on the back face of the semiconductor, followed by about 1,000 Angstroms of titanium, and then a final layer of about 500 Angstroms of platinum, with deposition carried out at 435° C. The front face of the specimen was etched for 4 minutes with the HF-NH$_4$F solution as in Example 1, washed with deionized water for 30 seconds, dried with nitrogen gas, and immediately placed in the evaporator with a blank silicon wafer placed over the front face for protection. The sample was heated to 465° C. at $10^{-4}$ mbar pressure for 30 minutes to oxidize the front face at the same time as an ohmic contact was deposited on another wafer. The specimen was replaced in the evaporation unit, pumped down to $10^{-5}$ millibars pressure, and heated to 112° C. over a one-half hour time period. Approximately 8 Angstroms of platinum were deposited in a 40 second time period. The cell was prepared and tested as in Example 1. The device was subjected to 1 sun illumination with a ¼ inch fiber optic placed against the beaker, and the cell had an illumination area of 0.45 cm$^2$. A short circuit current of 8.3 milliamps and an open circuit voltage of 0.35 volts were measured.

EXAMPLE 13

In this example, the specimen was prepared from a p-type, 1.0 ohm centimeter resistivity, single-crystal silicon wafer. A back face ohmic contact was prepared by depositing about 1,000 Angstroms of aluminum and about 1,000 Angstroms of gold sequentially by electron beam evaporation from material in carbon crucibles. The deposited aluminum acted to dope the silicon layer to make a p+ doped layer. The specimen was removed, the front face was etched for 30 seconds in HF-NH$_4$F solution, washed with deionized water for 30 seconds, and dried with a flowing nitrogen gas stream. The specimen was placed in a ceramic boat and the entire assembly placed into a quartz tube in a tube furnace held at 576° C. The ceramic boat containing the silicon specimen was moved into the tube furnace over a 3 minute time period; oxygen gas was passed over the specimen for a period of 3 hours at a temperature of 576° C. in the furnace, and nitrogen gas was turned on as the oxygen gas stream was turned off. The temperature was allowed to decrease to 200° C. over a one hour time period, the furnace was opened, and the ceramic boat and specimen were removed from the furnace to cool to room temperature. A portion of this sample was analyzed by Auger spectroscopy and a layer of approximately 6 Angstroms of silicon oxide was measured as a consequence of the oxygen treatment at 576° C. The specimen was placed into the evaporation unit, pumped to $10^{-3}$ millibars pressure, oxygen gas let into the evaporation unit to a pressure of approximately 1 atmosphere, and then the unit was pumped to $10^{-5}$ millibars pressure. At that point 30 Angstroms of chromium were electron beam deposited onto the front face of the specimen, and about 8 Angstroms of platinum was electron beam deposited over the chromium layer. During deposition of the platinum, the specimen was held at a temperature of 112° C., and after deposition of the platinum, the specimen was allowed to cool to room temperature. This treated specimen was made into a photoelectrochemical cell and tested, as in Example 9, with an illumination area of 0.12 cm$^2$. The short circuit current was determined to be 0.30 milliamps or 2.5 milliamps/cm$^2$ and the open circuit voltage was 0.34 volts. Measurements were made in air for the same area, and a short circuit current of 0.70 milliamps was measured or a 5.8 milliamps/cm$^2$ current density with an open circuit voltage of 0.30 volts.

EXAMPLE 14

The crystal used in this example had a p-type resistivity of 0.1 ohm centimeters. The ohmic contact was made and the front face etched and oxidized as in Example 13. The specimen was then placed front face up in the evaporation unit, the evaporation unit was pumped to a pressure of $10^{-5}$ millibars pressure, and 200 Angstroms of SnO$_2$ were electron beam deposited at a rate of 1 Angstrom per second. The specimen was removed from the evaporation unit and placed in a ceramic boat. The specimen in the boat was heated in a Lindberg tube furnace in air to a temperature of 356° C. to partially oxidize the SnO$_2$. The specimen was held at a temperature of 356° C. in an air atmosphere for 1½ hours and was taken directly out of the furnace to cool to room temperature. The specimen was sealed in the photocell as in Example 9, and the measurements were carried out at 1 sun illumination with an area of illumination of 0.35 cm$^2$. In air the short circuit current was 3.6 milliamps and the open circuit voltage was 0.12 volts. Measurements were also done in an electrolyte of $S^{2-}/S_n^{2-}$ (polymeric) solution at 1 sun illumination, with an area of 0.35 cm$^2$. There was virtually 0 milliamp short circuit current and 0.28 volts open circuit voltage. In dilute iodine/iodide solution the open circuit voltage was 0.11 volts and the short circuit current was 0 milliamps. A glass slide was also deposited with SnO$_2$ and before annealing in air in the Lindberg tube furnace at 356° C., the resistivity was $8 \times 10^{-2}$ ohm centimeters with an 85.1 percent light transmissivity. After annealing in air the resistivity was $4.4 \times 10^{-3}$ ohm centimeters and the light transmissivity was 87.3 percent.

EXAMPLE 15

An 8 to 25 ohm resistivity n-silicon wafer was etched on the front face for 10 sec. with a 10 percent HF, 36 percent NH$_4$F solution, washed with deionized water and dried in a stream of nitorgen. The back side was then etched with the above solution for 1 minute, washed and dried as above, and brushed with a phosphorosilica solution, as used in Example 10, diluted 3 times with ethanol. The wafer was dried in air at 100° C. for 2 minutes, and heated in a water saturated stream of nitrogen for 30 minutes at 450° C., and moved out of the tube furnace over 5 minutes. The front face of the specimen was then etched 30 seconds with HF-NH$_4$F solution, washed with deionized water, and dried with a flowing nitrogen gas stream. The specimen was put in the evaporation unit, pumped to a pressure of $10^{-5}$ millibars pressure, and heated to a temperature of 150° C. Over a 10 minute time period 100 Angstroms of platinum were deposited on the front face. The back face was etched for 7 minutes with HF-NH$_4$F solution, washed with deionized water and dried in nitrogen. After placing in the evaporator, 1,000 Angstroms Pt were deposited on the back face. After preparation and testing in the same manner as in Example 9, the short circuit current was measured to be 0.34 milliamps, and the open circuit voltage was 0.21 volts in air. The series resistance was 11.5 ohms, and the shunt resistance was 1.3 k ohms. Tests were done with 1 sun illumination and a ¼ inch fiber optic device was placed against the beaker containing the electrolyte and cell. The short circuit current was 2.4 milliamps, and the open circuit voltage was 0.3 volts with an illumination area of 0.27 cm$^2$. The series resistance was 9.5 ohms and the shunt resistance was greater than 10 k ohms.

EXAMPLE 16

An ohmic contact was made on both the front and back surfaces of an n-type, phosphorous doped single crystal of 8-25 ohm centimeters resistivity. The back unpolished face was etched for 2 minutes with a solution containing 10% HF/36% NH$_4$F, the specimen was washed with deionized water, dried in a stream of nitrogen, and mounted in the electron beam evaporator with a 6.7 to 12 ohm cm n-silicon wafer against the front face to prevent contamination of the front face. The sample was loaded into the evaporation chamber and was pumped down to approximately $10^{-5}$ millibars pressure. The substrate was heated to 440° C. over 30 min, and held at 440° C. for 20 minutes. Vanadium phosphide of thickness 150 Å was electron beam deposited over a 5 minute period. The aluminum substrate holder was rotated during evaporation. The vanadium phosphide target was a large pressed pellet placed in a carbon crucible for evaporation. Between runs the VP pellet was stored under nitrogen. Next, 1000 Å titanium was deposited over 1.5 minutes time period. 500 Å of platinum was then deposited over 8 minutes. The heat was then turned off, and the substrate holder cooled to 127° C. over approximately 1 hour. Nitrogen was let into the chamber, and the sample removed approximately 1 hour later.

The contact on the polished front face was made as follows: the front face was etched for 4 minutes in the HF/NH$_4$F solution, washed well in deionized water, and dried in a stream of nitrogen gas. The 150 Å vanadium phosphide, 1000 Å Ti, and 500 Å Pt were deposited under the conditions given above.

All the edges of the wafer were trimmed and electrical connections were made to the back and front face by connecting flattened zig-zag sections of 20 gauge silver-coated copper wire using silver paste (SPI #5001). The connections were then coated over with Devcon epoxy. The DC resistance was 2.3 ohm with the back face positive, and 2.2 ohm with the front face positive. The current versus voltage plot showed an almost linear response over the voltage range ±40 mV. With the front face negative, the response was almost linear up to at least 0.35 V, giving a resistance of 2.6 ohm.

EXAMPLE 17

A silicon n-type crystal as in Example 16, was etched on the back face for approximately 20 min. in 10% HF, 36% NH$_4$F solution, washed with deionized water for about 30 seconds, and dried in air. Then, about 1000 Å of lanthanum hexaboride (99% Alfa Chemicals) and about 5000 Å platinum (Marz grade, MRC) were e-beam deposited at about $10^{-4}$ millibars pressure in the evaporation unit. The substrate holder was not rotated or heated.

The polished front face was etched for 1 minute with 10% HF, 36% NH$_4$F solution, washed with deionized water for about 30 seconds, and dried in air. After immediately placing the wafer in the evaporator and pumping the chamber to $10^{-4}$ millibars pressure, 20 Å SiO$_2$ was electron beam deposited from a crushed quartz tube in a carbon crucible, followed by 200 Å of Pt, both deposited with an unheated aluminum substrate holder.

Electrical connections were made to both the back and front face as in Example 9, and the whole cell, apart from a portion of the front face, was sealed with Devcon 5-min. epoxy. The photoelectrode was tested in the following 3 configurations: (1) The photoelectrode was in air and the two contacts on the photoelectrode, front and back face, were connected to two platinized platinum electrodes both immersed in the same redox solution. The voltage was measured between the back face contact of the photoelectrode and one of the platinum electrodes; (2) The entire photoelectrode was immersed in the redox solution, and the voltage was measured between the front and back contacts of the photoelectrode; (3) The entire photoelectrode was immersed in the redox solution but only the back contact was utilized. This was joined, via a voltmeter, to a platinized platinum counter electrode placed in the same redox solution. Three different redox solutions were used: (1) 0.04M $Br_2$, 0.4M NaBr, 0.4M KCl; (2) 0.02M $I_2$, 0.4M NaI, 0.5M KCl; and (3) 1M Fe(EDTA)$Cl_2$, 1M Fe(EDTA)Cl, all made up with deionized water. The redox potentials (in volts) of the solutions were measured with an in situ standard calomel electrode using a Keithley electrometer. The following table shows open circuit voltages obtained for the 3 configurations described above.

| Redox Solution | Redox Potential | 1 sun illumination | | |
|---|---|---|---|---|
| | | $V_1$ | $V_2$ | $V_3$ |
| $Br_2/Br^-$ | +0.84 | 0.30 | 0.42 | 0.44 |
| $I_2/I^-$ | +0.31 | 0.30 | 0.32 | 0.30 |
| $Fe^{3+}/Fe^{2+}$ | −0.20 | 0.33 | 0.27 | 0.28 |

EXAMPLE 18

An n-type silicon crystal as in Example 17 had an ohmic contact prepared as in Example 1. The front face was swabbed with a Q-tip, was etched with 10% HF, 36% $NH_4F$ solution twice for two minutes, washed in deionized water, dried in a stream of nitrogen gas, and immediately placed in the evaporation unit, which was pumped down to $10^{-4}$ millibars pressure. The sample was heated to 110° C. over a 30 minute time, and about 8 Angstroms of tantalum were deposited at a rate of 0.08 Angstrom per second at 110° C., followed by depositing about 10 Angstroms of platinum at a rate of about 0.17 Angstrom per second. The substrate was cooled to 60° C., nitrogen gas was let into the chamber, and the samples removed when the temperature reached ambient. Under the conditions of evaporation using a very slow rate of deposition in a poor vacuum, the tantalum oxidized to a film of tantalum oxide.

Both back and front face contacts were made as in Examples 1 and 9 but using Devcon 5-minute epoxy, leaving 0.45 $cm^2$ of the front face exposed for illumination. At one sun illumination in air, the open circuit voltage was 0.41 volts, and the short circuit current was 2.9 mA. At one sun illumination in the dilute iodine-iodide solution of Example 1, the open circuit voltage was 0.45 volts, and the short circuit current 5.4 mA. In a dilute bromide-bromine solution and having an emf versus standard calomel emf of 0.77 volt, and at one sun illumination, the open circuit voltage was 0.52 volt and the short circuit current was 1.7 mA. In the sulfide/polysulfide solution, and having an emf versus standard calomel emf of minus 0.71 volts, at one sun illumination, the open circuit voltage was 0.06 volt, and the short circuit current was 0.01 mA. Under 0.69 sun illumination, using a concentrated $I_2/I^-$ solution, and having an emf versus standard calomel of 0.33 volts, the open circuit voltage was 0.37 volt, and the short circuit current was 4.0 mA. Under 0.69 sun lumination, using a concentrated $Br_2/Br^-$ solution and having an of emf versus standard calomel emf of 0.79 volts, the open circuit voltage was 0.50 volt, the short circuit current was 4.0 mA, and the efficiency was about 5 percent. For all the above measurements, the short circuit currents and open circuit voltages were 0 in the dark.

EXAMPLE 19

The crystal was the same as Example 1, and the ohmic contact was made as in Example 1. The front faces of the three crystals were etched in 24% HF solution twice each for 5 minutes, washed in deionized water, and dried in a stream of flowing nitrogen gas. Samples A, B, and C, were left to oxidize in air for one hour, 25 minutes, and two minutes, respectively, were placed in the evaporation unit, pumped to $2 \times 10^{-6}$ millibars pressure, and about 20 Angstroms of platinum were deposited (without sample heating) at a rate of 0.13 Angstrom per second. After deposition, the samples were heated to 330° C. in vacuum over a time period of about 30 minutes, left for 5 minutes at 330° C., cooled to 200° C. in 15 minutes, nitrogen let into the chamber, and the samples cooled to room temperature. The cells were prepared and tested in an iodine-iodide solution as in Example 1 at one sun illumination. The illuminated areas, short circuit currents, and open circuit voltages, respectively, were as follows: cell A; 0.20 $cm^2$, 3.1 mA, 0.32 V; cell B, 0.21 $cm^2$, 3.0 mA, 0.30 V; cell C, 0.32 $cm^2$, 6.2 mA and 0.36 V. Cells A and B continued to function with approximately the above outputs after 25 days continuous operation at one sun illumination in iodine-iodide solution. Cell C ceased to function after two hours under the same conditions.

EXAMPLE 20

The back of a one ohm cm resistivity, p-type silicon crystal was etched for 3 minutes in 10% HF, 36% $NH_4F$ solution, and washed in deionized water. Five thousand Angstroms of aluminum were deposited on the sample in the evaporation unit after pumping to the $10^{-4}$ millibars pressure. The front face was etched for 30 seconds with 10% HF, 36% $NH_4F$, washed with deionized water, dried in a stream of nitrogen gas, placed in a Lindberg tube furnace in an aluminum boat, heated to 580° C. for 8.5 hours, and cooled in the furnace to room temperature. The edges of the crystals were masked with masking tape prior to placing in the evaporation unit and pumped down to $10^{-4}$ millibars pressure. The sample was heated to 320° C. on the rotating substrate holder, and 100 Angstroms of platinum were deposited.

The front face of the crystal was examined by Auger electron spectroscopy while argon-ion etching. Peaks from platinum, oxygen, silicon, and carbon were monitored as a function of depth from the surface. The main features were consistent with, as a function of depth, a platinum layer with virtually no oxygen, then a silicon dioxide layer (which was confirmed by the presence of silicon in a +4 valence state), followed by the silicon base semiconductor. A minor feature at the immediate surface indicates the presence of a small proportion of silicon dioxide over the platinum layer.

EXAMPLE 21

An n-type silicon crystal of 1.0 ohm centimeter resistivity was prepared as in Example 18. After etching and washing, the crystal was immediately placed in the evaporator and pumped down to $10^{-4}$ mbar pressure. The sample was heated to 100° C. and 8 Angstroms of yttrium doped $ZrO_2$ was deposited by electron beam evaporation from a pellet pressed from $ZrO_2$ powder doped with 8 percent $Y_2O_3$ placed in an aluminum oxide crucible. Deposition was performed at about 0.08 Angstroms/second at $5 \times 10^{-3}$ mbar pressure. The silicon crystal was heated to 200° C. during deposition of 10 Angstroms of platinum at a rate of 0.09 Angstroms/second. After cooling to room temperature overnight the specimen was made into a photoelectrode as in Example 9 with a cell illumination area of 0.18 cm². At 1 sun illumination in air the open circuit voltage was 0.27 volts, and the short circuit current was 0.17 mA. At 1 sun illumination in the solution of Example 1 the open circuit voltage was 0.50 volts, the short circuit current was 3.8 mA, and the efficiency was about 4 percent. In a dilute bromide-bromine solution the open circuit voltage was 0.56 volts, and the short circuit current was 3.6 mA. Both the open circuit voltages and short circuit currents were zero without any illumination.

EXAMPLE 22

In this example the type of starting crystal and preparation of the back ohmic contact are the same as in Example 1. The specimen was etched for 4 minutes in HF/NH$_4$F solution, washed with deionized water, dried in a flowing nitrogen gas stream, and exposed to air for 25 minutes under ambient conditions. The specimen was placed in the evaporator unit, the chamber pumped to a pressure of $10^{-3}$ mbar and backfilled to 1 atmosphere pressure with oxygen. The chamber was then pumped to $5 \times 10^{-5}$ mbar pressure, and 500 Angstroms of tin oxide doped with indium were electron beam deposited from an indium-tin oxide pellet held in an alumina crucible. The indium-tin oxide material was obtained from EM Chemicals Corporation. After deposition of the doped tin oxide, the crystal was placed in an alumina boat and positioned in the hot zone of a tube furnace at 211° C. for 30 minutes in an air atmosphere. After this annealing step, the resistivity of an indium doped, tin oxide film electron beam deposited on a glass slide was reduced from $4.5 \times 10^{-2}$ to $7.5 \times 10^{-4}$ ohm centimeters, and the light transmissivity was increased from 21.6 to 66.6 percent.

The crystal was replaced in the evaporator unit and pumped to a pressure of $10^{-4}$ mbar, and 8 Angstroms of platinum were deposited at a crystal temperature of about 110° C. and with a deposition rate of 0.18 Angstroms/second. The photoelectrode was prepared and tested as in Example 1. At 1 sun illumination and using an iodine/iodide redox couple as in Example 1, the short circuit current was 3.9 mA with a cell area of 0.21 cm², and the open circuit voltage was 0.27 volts. The cell lasted six days under continuous operation.

I claim:

1. A multilayer structure which comprises:
(a) an n-type semiconductor;
(b) a first layer which is in direct contact with said n-type semiconductor, wherein said first layer comprises a compound which contains at least one first element in anionic form which is selected from the group consisting of phosphorus, arsenic and antimony, and at least one second element in cationic form which is selected from the group consisting of vanadium, titanium, zirconium, hafnium, niobium and tantalum; and
(c) a second layer comprising a conducting material which is in direct contact with said first layer.

2. The multilayer structure as set forth in claim 1 wherein said semiconductor is n-type silicon.

3. The multilayer structure as set forth in claim 2 wherein said conducting material comprises a material which is selected from the group consisting of Pt, Pd, Au, W, Ta, MoSi$_2$, doped oxides and conducting organics.

4. The multilayer structure as set forth in claim 2 wherein said first layer comprises vanadium phosphide.

5. The multilayer structure as set forth in claim 4 wherein said conducting material comprises at least one material selected from the group consisting of platinum and titanium.

6. A multilayer structure which comprises:
(a) an n-type silicon semiconductor;
(b) a layer of a lanthanide boride which is in direct contact with said n-type semiconductor; and
(c) a layer of conducting material on said lanthanide boride layer.

7. The multilayer structure as set forth in claim 6 wherein said lanthanide boride is lanthanum hexaboride.

8. The multilayer structure as set forth in claim 6 wherein said conducting material comprises a material which is selected from the group consisting of Pt, Pd, Au, W, Ta, MoSi$_2$, doped oxides and conducting organics.

* * * * *